United States Patent [19]

Kirita et al.

[11] 4,063,973

[45] Dec. 20, 1977

[54] METHOD OF MAKING A SEMICONDUCTOR DEVICE

[75] Inventors: Kei Kirita, Tokyo; Yasutaka Tsuji, Kawasaki; Takahiko Moriya, Yokosuka, all of Japan

[73] Assignee: Tokyo Shibaura Electric Co., Ltd., Japan

[21] Appl. No.: 738,841

[22] Filed: Nov. 4, 1976

[30] Foreign Application Priority Data

| Nov. 10, 1975 | Japan | 50-133953 |
| May 10, 1976 | Japan | 51-52146 |
| June 1, 1976 | Japan | 51-62962 |

[51] Int. Cl.² .......................................... H01L 21/225
[52] U.S. Cl. ..................................... 148/188; 148/175; 148/187; 148/190
[58] Field of Search ............... 148/188, 187, 190, 175

[56] References Cited

U.S. PATENT DOCUMENTS

| 3,460,007 | 8/1969 | Scott | 148/188 X |
| 3,502,517 | 3/1970 | Sussmann | 148/175 |
| 3,664,896 | 5/1972 | Duncan | 148/187 |
| 3,694,276 | 9/1972 | Wakamiya et al. | 148/174 |
| 3,764,413 | 1/1973 | Kakizaki et al. | 148/188 |
| 3,915,767 | 10/1975 | Welliver | 148/190 |
| 3,928,095 | 12/1975 | Harigaya et al. | 148/188 |

OTHER PUBLICATIONS

Fair, *J. of Electrochem. Soc.*, vol. 119, No. 10, Oct. 1972, pp. 1389–1394.
Takagi et al., *J. of the Japan Soc. of Applied Physics*, vol. 42, 1973, pp. 101–109.

*Primary Examiner*—G. Ozaki
*Attorney, Agent, or Firm*—Oblon, Fisher, Spivak, McClelland & Maier

[57] ABSTRACT

A non-monocrystalline semiconductor layer which contains predetermined impurities is disposed on a semiconductor substrate. Then, on this semiconductor layer an oxide layer is formed which contains the same type impurities as in the semiconductor layer. The device is then heated at a high temperature, thus causing the impurities to diffuse into the semiconductor substrate and form impurity diffused regions. Suitable electrodes are deposited on the impurity diffused regions.

10 Claims, 34 Drawing Figures

METHOD OF MAKING A SEMICONDUCTOR DEVICE

BACKGROUND OF THE INVENTION

This invention relates to a method of making a semiconductor device, and more particularly to an improved impurity diffusion method.

Several diffusion methods are known. Among these methods, solid-to-solid diffusion methods are believed to have many advantages.

One method is to use an impurity doped oxide as a diffusion source. For details, see J. Electrochem. Soc. SOLID-STATE SCIENCE AND TECHNOLOGY October 1972 Vol. 119, No. 10, pp. 1389 – 1394.

Another method is to use a single doped poly-silicon layer as a diffusion source. For details, see Proceedings of the 4th Conference on Solid State Devices, Tokyo, 1972 Supplement to the Journal of the Japan Society of Applied Physics, Vol. 42, 1973, pp. 101 – 109.

In the former method surface damage is often observed after diffusion, and in the latter method the flatness of the diffused to region is also impaired, thus limiting the use of the method to a narrow field.

SUMMARY OF THE INVENTION

It is an object of this invention to provide a highly reproducible diffusion method.

Another object of this invention is to provide an improved diffusion method which enables diffusion in a short time.

Yet another object of the invention is to provide an improved diffusion method which enables high impurity concentration diffusion.

A further object of the invention is to provide an improved diffusion method which assure flatness and cleanness of the surface after diffusion.

A still further object of the invention is to provide an improved method of making bipolar devices.

According to this invention, the foregoing and other objects are attained by providing a double-layer structure, consisting of a non-monocrystalline semiconductor layer and an oxide layer, both of which are doped with predetermined impurities, as the diffusion source.

DESCRIPTION OF THE PREFERRED EMBODIMENTS

Referring now to FIG. 1, there is shown one embodiment of this invention applied to the high impurity concentration As (Arsenic) diffusion method. In FIG. 1(A) – (F) denote each step of the fabrication process.

A semiconductor substrate 11, for example, Si, of given conductivity type with at least one major surface is prepared. In this embodiment P-type silicon with the resistivity of 20 $\Omega$ .cm is used. On this Si substrate 11 an insulating layer 12 such as $SiO_2$ is formed as in FIG. 1(A). The thickness of this $SiO_2$ 12 is 5000 A.

In the next step standard photo engraving process techniques are employed to form diffusion windows in the $SiO_2$ layer 12 as shown in FIG. 1 (B). Thus openings 13a,13b are formed. Next, in step (C) a non-monocrystalline Si layer 13 doped with As is deposited over the whole object. The thickness of the Si layer 13 is preferably between 50 and 300 A (for example 100 A). The impurity As concentration is chosen to be 1 – 5 $\times$ $10^{21}/cm^3$. This Si layer 13 is formed by thermal decomposition of a silane gas and arsine gas mixture at 400° – 800° C. Depending on the temperature this Si layer will be amorphous or polycrystalline. In actual practice, the process of this embodiment was carried out in a reaction chamber having a volume of around 20 liters. The flow rate of silane gas was 3 cc/min. and the arsine gas flow rate was 0.001 – 1.0 to that of silane gas. The carrier gas flow rate was chosen to be 20 liters/min. In the next step (D), $O_2$ gas is mixed at the rate of 500 cc/min, thus forming a $SiO_2$ layer 14 doped with As on the Si layer 13 with a thickness of 500 – 4000 A (say 2000 A). The impurity concentration of As in the $SiO_2$ layer was selected to be 5 $\times$ $10^{21}/cm^3$. The (D) step is done following the (C) step without removing the substrate from the reaction chamber so as to maintain the cleanliness of the substrate.

Figure 1A:
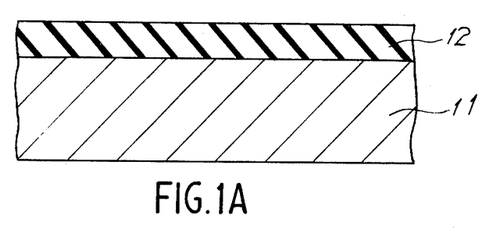
FIG. 1(A) – (F) are cross sectional views of a substrate during successive steps in making a device according to one embodiment.
Figure 1B:
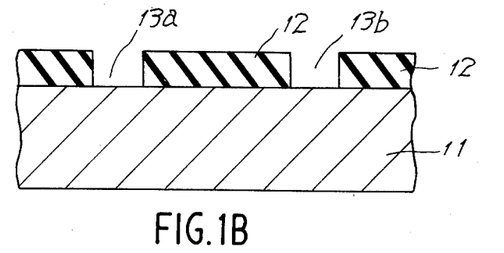
Figure 1C:
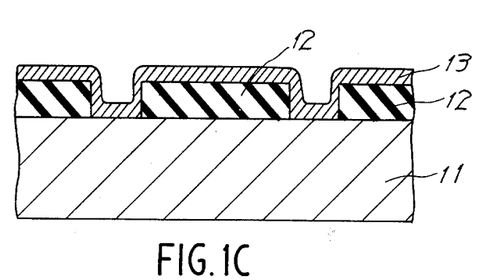
Figure 1D:
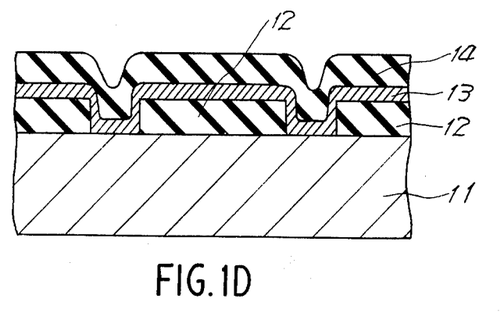
Figure 1E:
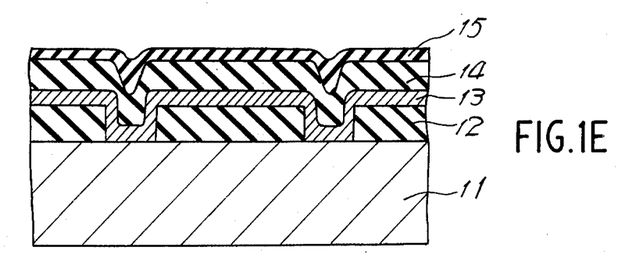
Figure 1F:
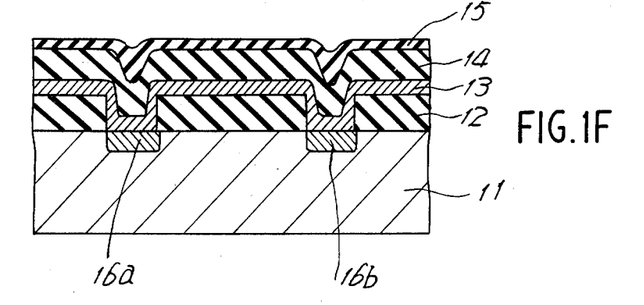

Advantageously, in the next step (E), a non-doped $SiO_2$ layer 15 with a thickness of 500 – 1000 A is deposited over the $SiO_2$ layer 14 so as to prevent completely the cut diffusion of impurity As from the $SiO_2$ layer 14. The drive-in step was performed in an oxidizing ambient at 1100° C in 30 minutes using a double-layer diffusion source. Diffused regions having a sheet resistivity of 9$\Omega$/□ and a junction depth of 0.7 $\mu$ are obtained.

Figure 2:
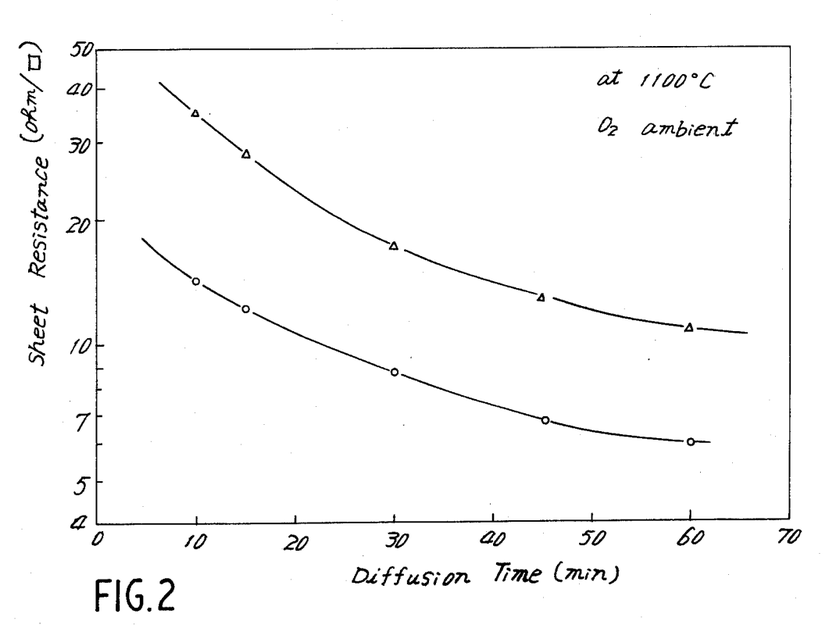
FIG. 2 and 6 are diagrams illustrating the effects of this invention.

With different diffusion times, a sheet resistivity change at 1100° C in an oxidizing ambient was measured. The result is shown in FIG. 2. Here (100) P-type Si with a resistivity of $\sim$20$\Omega$. cm is used, and the small circle marks represent samples fabricated according to the invention having a double layer of polycrystalline Si layer doped with 4 $\times$ $10^{21}/cm^3$ As and a $SiO_2$ layer doped with 5 $\times$ $10^{21}/cm^3$ As. The thickness of the layers are 100 A and 2000 A, respectively. To compare the result with the conventional doped oxide diffusion method, samples fabricated by using a doped oxide layer (as Silica Glass) with a thickness of 3000 A and As concentration of 5 $\times$ $10^{21}/cm^3$ were tested (represented by triangular marks). The diffusion temperature and diffusion ambient were the same for both methods. It is apparent that a lower sheet resistance or a high impurity concentration is easily obtained. It is also confirmed that good uniformity and reproducibility of the sheet resistivity of the diffused regions is obtained without causing surface damage or spoiling the surface smoothness.

The above-mentioned desirable phenomena in the present technique can be interpreted as follows. In the double-layer method, the arsenic diffusion into silicon takes place from the doped poly-Si layer where the diffusion coefficient of arsenic is usually larger, compared with those in the AsSG and single-crystal silicon.

Also, accumulation of the arsenic atoms does not occur at the interface between the poly-Si layer and the silicon substrate, as is the case at the interface between AsSG and silicon. Moreover, the placement of the AsSG over the doped poly-Si layer plays an important role of supplying a large amount of arsenic diffusants to the poly-Si layer, partly due to the segregation effect in the Si-SiO$_2$ system. This phenomenon is promoted further by the concurrent oxidation of the poly-Si layer during the drive-in process. Thus, the high concentration arsenic diffusion into silicon can be accomplished without damage to the silicon surfaces. Furthermore, arsenic diffuses into silicon very uniformly and a uniform sheet resistivity can be achieved, even if the thickness and/or the doping concentrations of the two layers are not uniform. This is one of the most important features of this invention.

Moreover, this technique offers a smooth diffusion surface of silicon after removing the source layers because the poly-Si layers are thin enough to get a smooth surface. Also the oxidation of poly-Si layers during the drive-in step makes removal of the source layers easy and complete. Consequently, this technology can establish the high-concentration diffusion layers with smooth surfaces required for buried collectors in bipolar devices and sources and drains in MOS devices.

Several modifications of this embodiment are possible. Impurity atoms with small diffusion coefficients such as Sb, Bi, and Ga can be used instead of As. As for the semiconductor substrate Ge, III-V, and II-VI compound semiconductors can be used.

SECOND EMBODIMENT

Referring now to FIG. 3, there is shown another embodiment of this invention applied to the fabrication of a bipolar device. Standard fabrication techniques mentioned in the above embodiment will not be described in detail.

Figure 3A:
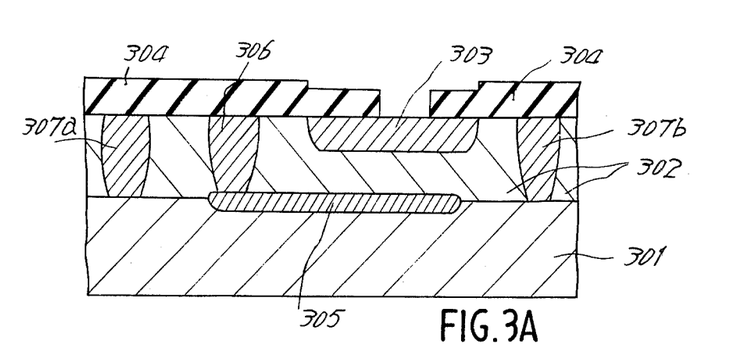
FIG. 3(A) – (F) are cross sectional views of a substrate during successive steps in making a bipolar device according to this invention.
Figure 3B:
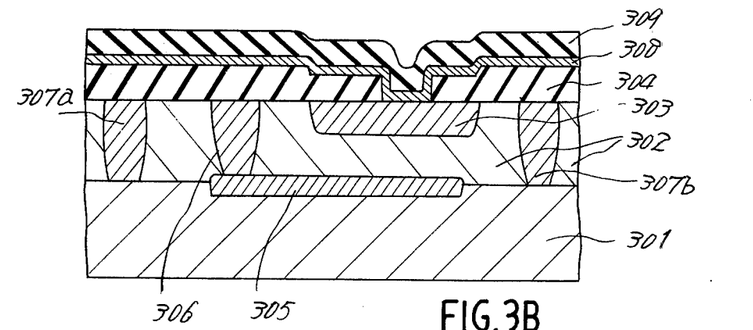
Figure 3C:
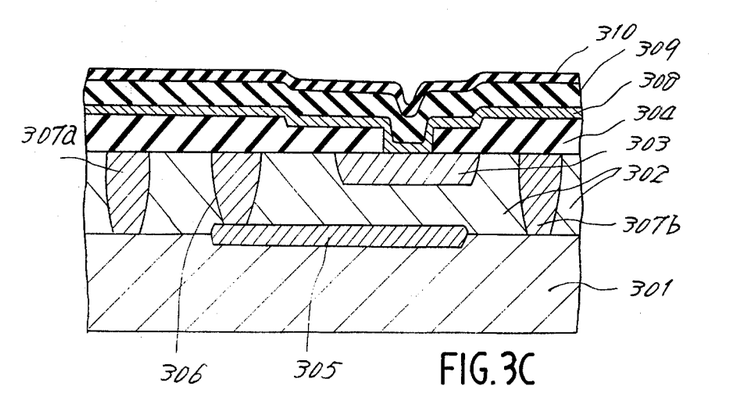
Figure 3D:
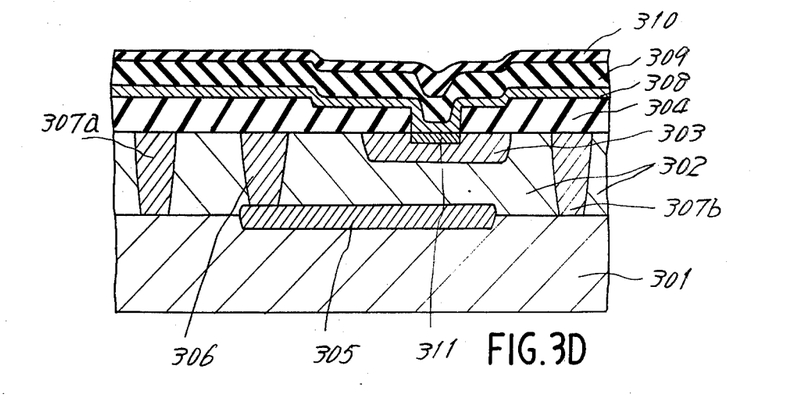
Figure 3E:
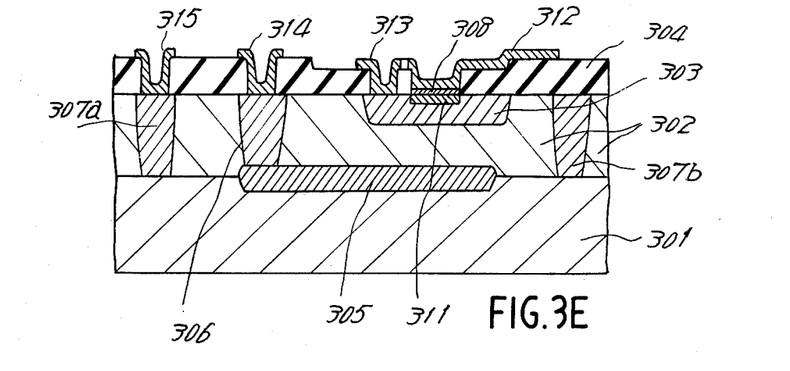
Figure 3F:
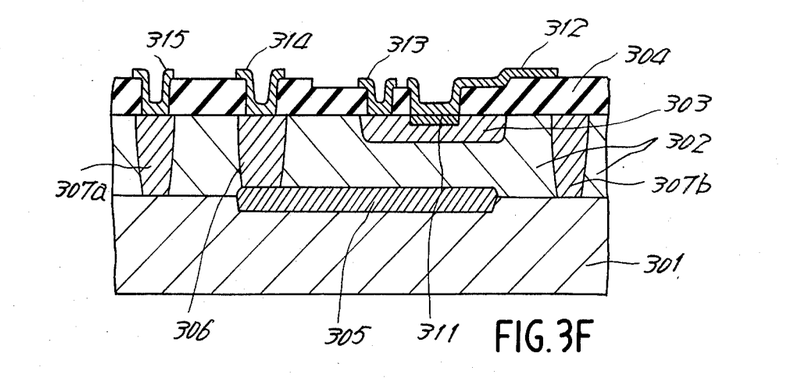

A P-type, 20Ω. cm Si substrate 301 is prepared, and on this Si substrate an n-type epitaxial layer 302, a portion of which will become collector regions, is formed. Base region 303 is to be formed by diffusion of impurity atoms through the predetermined openings of the insulating layer 304. Between the n-type epitaxial layer 302 and the Si substrate 301 an $n+$ type layer 305 is embedded. Another $n+$ layer 306 which serves as an electrical contact to this embedded layer 307 is formed by standard diffusion methods. P-type isolation regions 307$a$, 307$b$ are also formed. Openings are made in the insulating layer 304 to expose a portion of the substrate. Then, as shown in FIG. 3(B), a double layer of non-monocrystalline Si 308 (doped with 4.5 × 10$^{21}$/cm$^3$ Arsenic, 250 A thickness) and SiO$_2$ 309 (doped with 5 × 10$^{21}$/cm$^3$ Arsenic, 1000 A thickness) is formed. Next by step (C) non-doped SiO$_2$ 310 500 A thick preferably coated on the As doped SiO$_2$ 309. Then in step (D) the substrate is heated for 20 minutes in an O$_2$ ambient under 1000° C to form the emitter region 311. After this step, the newly formed SiO$_2$ layer is removed and in step (E) A1 electrodes 312, 313, 314 and 315 is applied to the exposed Si surface. Even if a thin Si layer 308 is left, ohmic contact is accomplished. In step (D) if the substrate is heated for more than 50 minutes, this thin Si layer 308 is completely oxidized, and so it is easy to remove the layer by HF solution. Next in step (F) A1 electrodes 312, 313, 314 and 315 is formed.

NPN transistors thus formed have many advantages in respect of speed and density etc.

THIRD EMBODIMENT

Referring now to FIG. 4, there is shown another embodiment of this invention applied to the fabrication of an npn transistor with a buried layer. In FIG. 4(A) - (E) correspond to the fabrication steps.

Figure 4A:
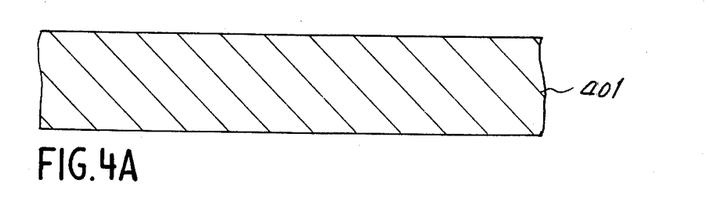
FIG. 4(A) – (G) are cross sectional views of substrate during successive steps in making a device with a buried layer according to one embodiment.
Figure 4B:
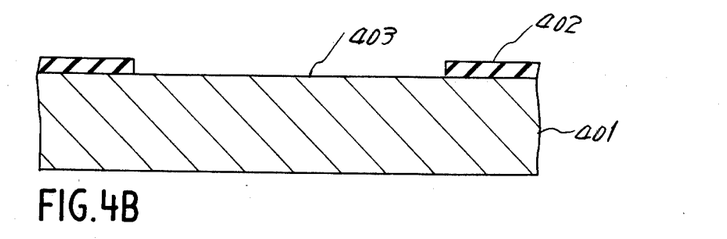
Figure 4C:
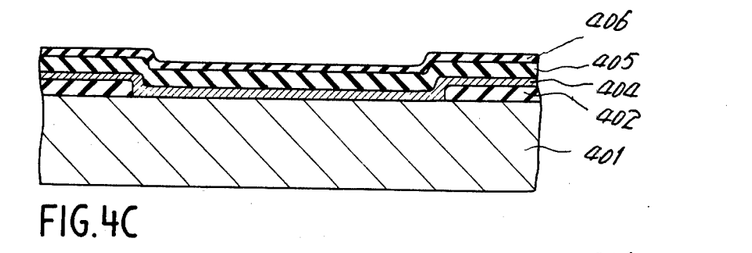
Figure 4D:
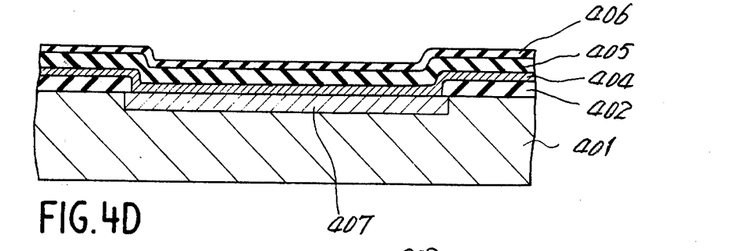
Figure 4E:
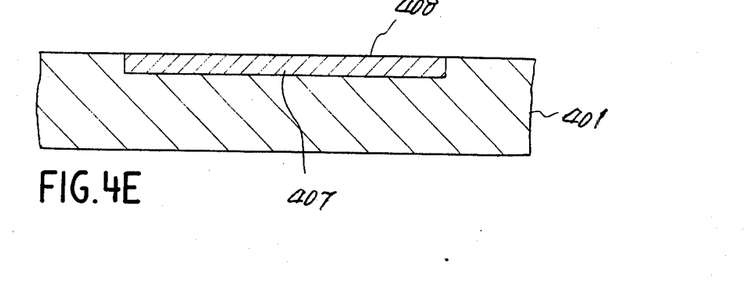
Figure 4F:
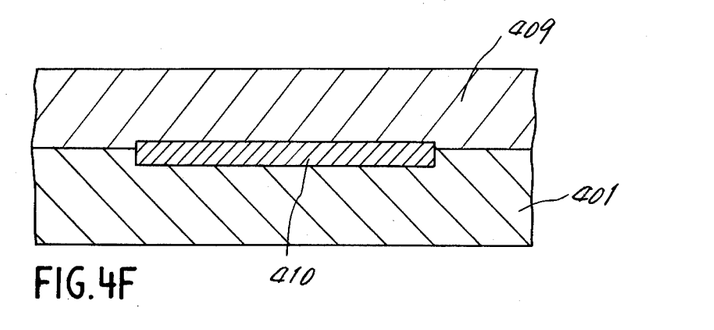
Figure 4G:
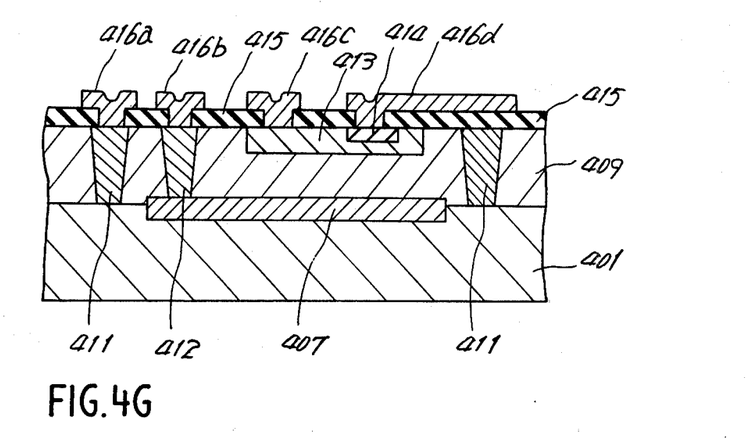

A mirror polished 20Ω. cm p-type Si substrate 401 is prepared in step (A). An insulating SiO$_2$ layer such as SiO$_2$ 402 which serves as a diffusion mask is formed on the substrate 401 as shown in step (B). This insulating layer can be formed by either oxidation, chemical vapor deposition or sputtering methods. Then a predetermined portion of the insulating layer 402 is removed to form opening 403. Next, in step (C) a very thin (50 - 300 A) non-monocrystalline Si layer 404 doped with 1 - 5 × 10$^{21}$/cm$^3$ arsenic is deposited on the substrate 401. Over this Si layer, 404 an amorphous SiO$_2$ layer 405 doped with 1 - 6 × 10$^{21}$/cm$^3$ arsenic and having a thickness of 500 - to 3000 A is formed. It is desirable to coat a 500 - 1000 A thick SiO$_2$ layer 406 over the amorphous SiO$_2$ layer 405 for the purpose of preventing out-diffusion of impurity atoms. Next in step (D) the substrate is heated for 30 - 45 minutes under a temperature of 1100° C in an oxidizing ambient, thus forming an $n+$ buried collector layer 407 with a thickness of $\simeq$ 1 $\mu$. In this step, the thin Si layer 404 is completely oxidized. Next in step (E), SiO$_2$ layer 406, amorphous SiO$_2$ layer 405, and Si layer 404 now changed to an oxided layer and the insulating layer 402, are all removed to expose the whole surface 408 of the substrate. The surface 408 thus obtained is flat and clean, and suitable for the epitaxial deposition step. Then on this smooth surface an n-type Si epitaxial layer 409 is deposited as shown in FIG. 4(F). After this step, from previously formed buried layer 407 impurity atoms may diffuse little by little into the epitaxial layer 409 to form again an $n+$ buried collector layer 410 1.5$\mu$ thick. Then in step (G) bipolar transistors are formed in this epitaxial layer 408. This bipolar transistor fabrication step is carried out by standard methods of the known art. In FIG. 4(G) $p+$ isolation region 411, $n+$ region 412, $p+$ base region 413, $n+$ emitter region 414, SiO$_2$ layer 415, and electrodes 416$a$,416$b$, 416$c$ and 416$d$ are shown. Of course one can use the diffusion method according to this invention when one makes the emitter region.

FOURTH EMBODIMENT

Referring now to FIG. 5(A) - (G) a modification for the $n+$ buried layer fabrication process is explained.

Figure 5A:
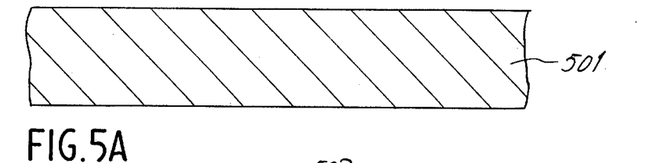
FIG. 5(A) – (G) are cross sectional views of a substrate during successive steps in making a device with a buried layer according to another embodiment.
Figure 5B:
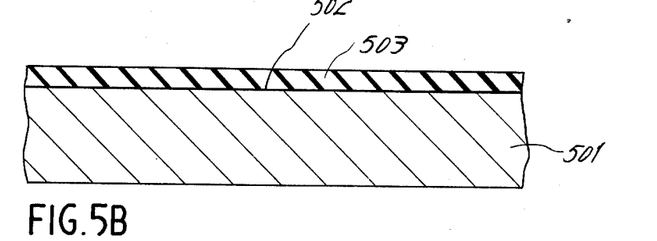
Figure 5C:
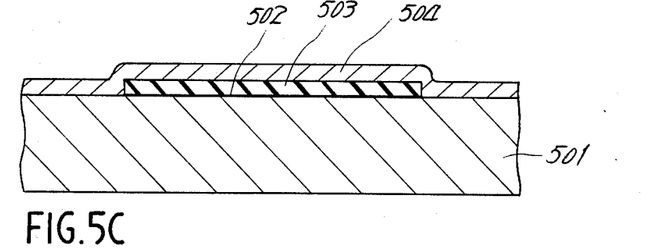
Figure 5D:
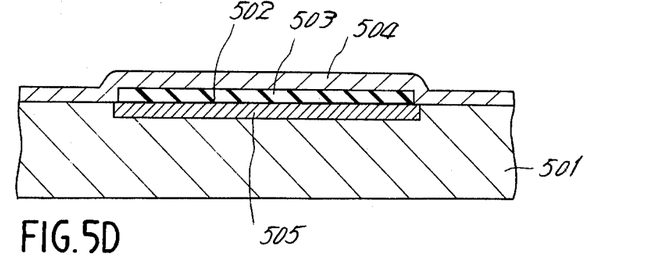
Figure 5E:
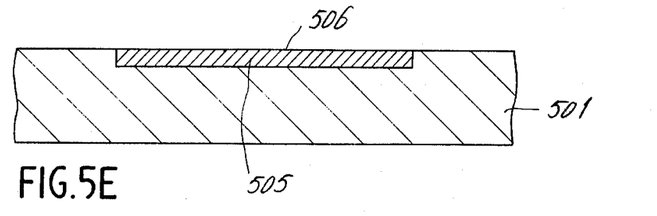
Figure 5F:
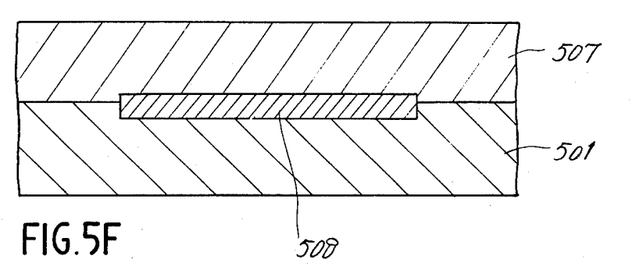
Figure 5G:
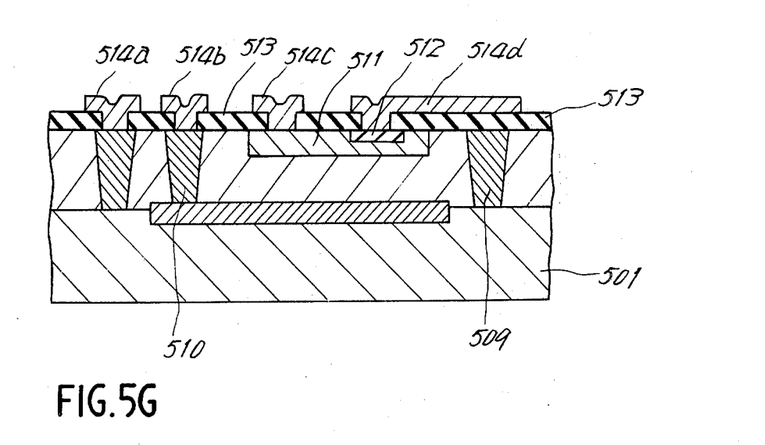

A P-type 20Ω. cm Si substrate 501 is prepared as shown in FIG. 5(A). In step (B), a non-monocrystalline Si layer 502 doped with As, is deposited over the whole surface of the substrate 501. The thickness of the Si layer 502 is between 50 to 300 A. On this Si layer is formed a doped oxide layer 503, 500 - 3000 A thick. Next in step (C) a predetermined portion of the double layer 502, 503 is removed and then a Chemical Vapor Deposition SiO$_2$ layer 504 with a thickness of 1000 - 3000 A is applied to the whole surface. This CVD SiO$_2$ layer 504 serves as a diffusion mask. Subsequently, the substrate is heated in an oxidizing ambient at a high temperature to form an $n+$ buried layer 505 as shown in (D) by diffusion of As from the double layer. Then in step (E) the double layer and the SiO$_2$ layer 504 are removed by the usual etching method, thus obtaining a smooth, clear surface 506 on which the following epitaxial growth is carried out. Then in step (F), an $n$ Si epitaxial layer 507 is deposited on the surface 506. After this step, an n+ buried collector layer 508 is obtained. Finally in step (G) the npn transistors are completed. In FIG. 5 (G), p+ isolation region 509, n+ diffusion region 510, P-type base region 511, n+ emitter 512, $SiO_2$ passivation film 513, and electrodes 514a – 514d are shown.

Figure 6:
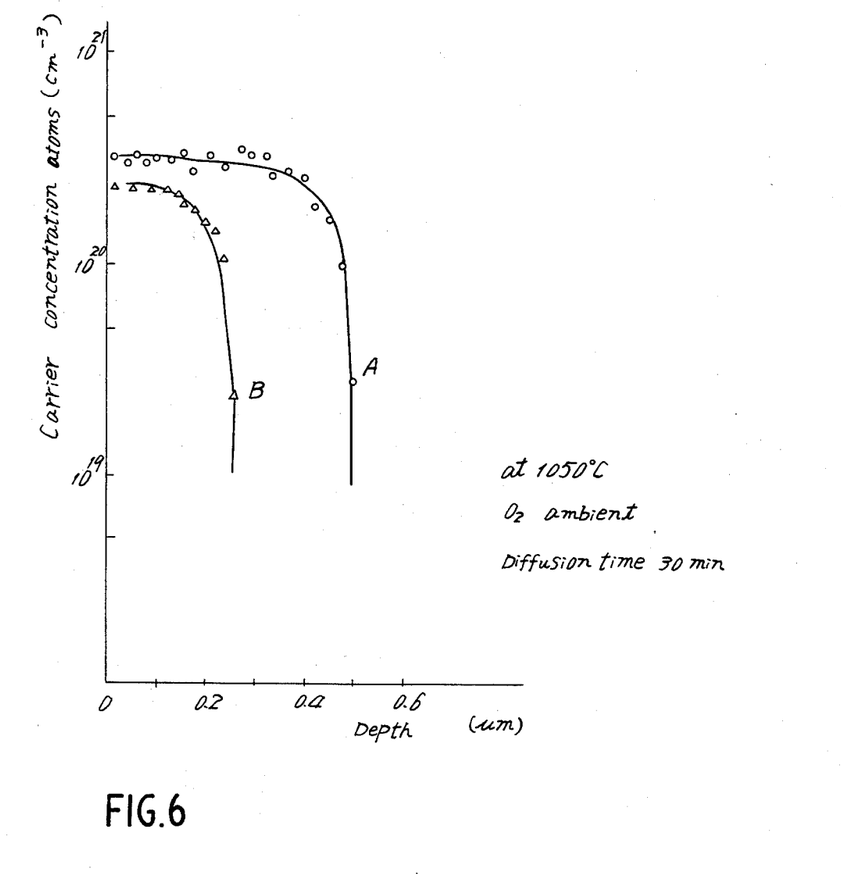

Transistors thus formed have many advantages with respect to flatness, high carrier concentration diffusion and so forth. Referring to FIG. 6 one of the advantages of this invention is explained. FIG. 6 shows the carrier concentration profiles resulting from a 30-min. diffusion of arsenic at 1050° C in an $O_2$ ambient from the two different diffusion sources. (A) denotes diffusion using double layer source and (B) denotes diffusion using a conventional single doped oxide layer source. Diffusion conditions were as follows. (A) . . . double layer of non-monocrystalline Si layer doped with $4 \times 10^{21}/cm^3$ arsenic (the thickness of the Si layer is 100 A) and $5 \times 10^{21}/cm^3$ As doped oxide layer with the thickness of 1000 A. (B) . . . single 3000 A thick dope oxide layer doped with $5 \times 10^{21}/cm^3$ arsenic.

It is apparent from FIG. 6 that by using a double layer as a diffusion source one can get a very high carrier concentration or a very low resistivity diffusion region.

Furthermore, as mentioned previously, the surface of the substrate on which the epitaxial layer is grown is very smooth. Realization of diffused layers with low sheet resistivity without causing surface damage or spoiling surface smoothness is accomplished in contrast to the conventional doped oxide method.

FIFTH EMBODIMENT

Referring now to FIG. 7 (A) – (F) the fabrication process of MOS devices is explained. A P-type $3\Omega$ . cm Si substrate 701 is prepared. Openings 702a, 702b are formed in the field oxide 703. In FIG. 7 (A), gate insulating layer 704 and gate electrode 705 are shown. In step (B) a very thin Si layer 706 50 – 500 A thick and doped with $1 – 6 \times 10^{21}/cm^3$ arsenic, and an insulating layer 707 500 – 3000 A thick and doped with $1 – 6 \times 10^{21}/cm^3$ arsenic are deposited in this order on the whole object. Advantageously, a non doped $SiO_2$ layer is deposited on the insulating layer 707 so as to prevent the outdiffusion of impurity arsenic.

Figure 7A:
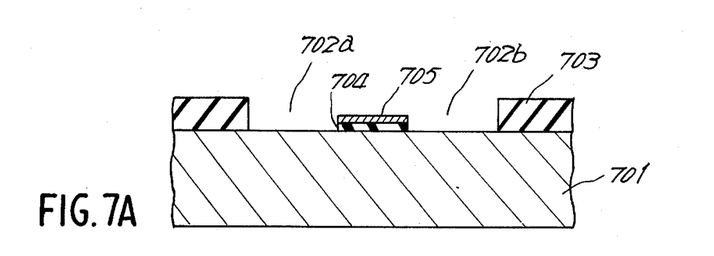
FIG. 7(A) – (F) are cross sectional views of a substrate during successive steps in making a MOSFET according to this invention.
Figure 7B:
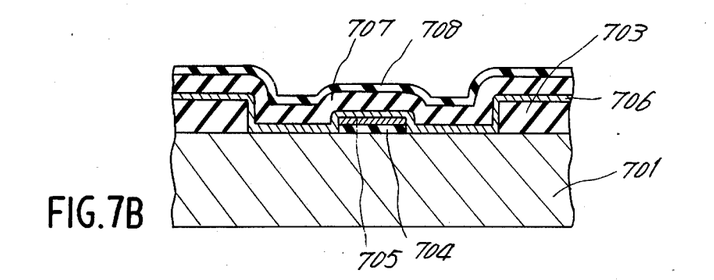
Figure 7C:
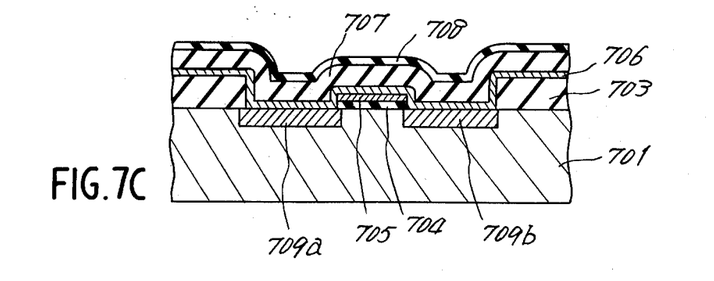
Figure 7D:
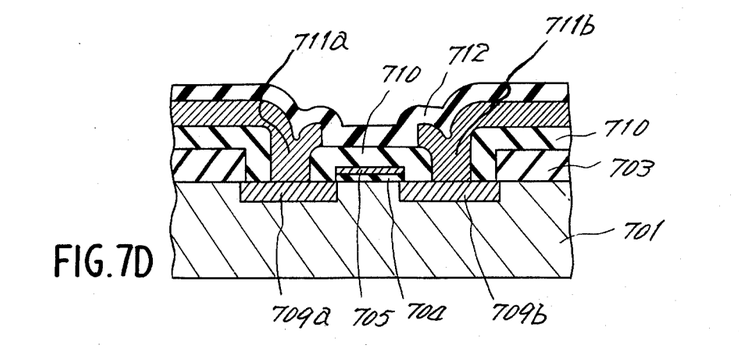

A wide variety of dielectric materials, such as silicon dioxide, silicon nitride, silicon oxi-nitride may be used. Subsequently in step (C) the substrate 701 is heated at 900 – 1100° C to form source and drain regions 709a, 709b, respectively. This process may be performed in an oxidizing atmosphere. Then in the next step (D) the layers 706, 707, 708 formed on the substrate are all removed and a new insulating layer 710 is formed on the substrate. Then openings 711a, 711b are made for the source and drain contacts. Passivation film 712 is formed on the surface and thus MIS FET's are fabricated.

Figure 7E:
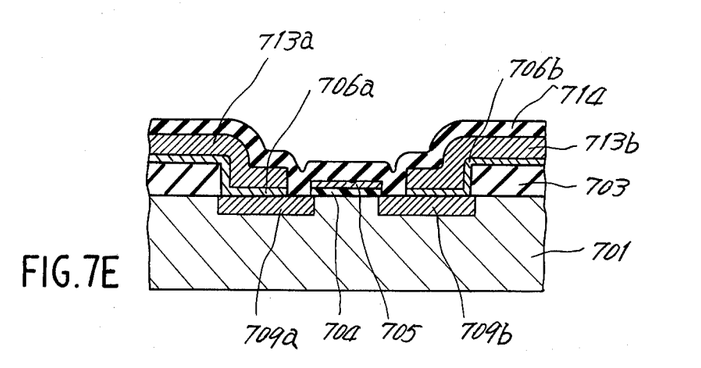
Figure 7F:
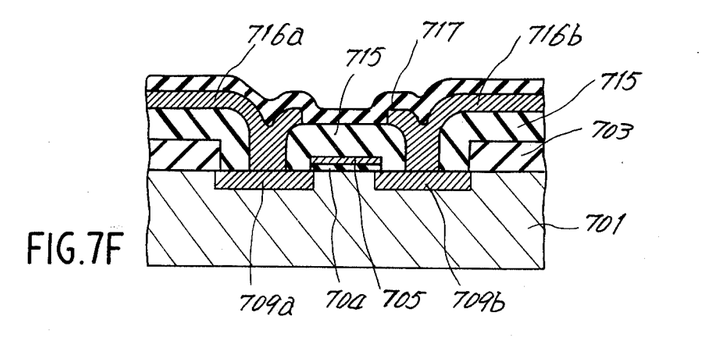

Some modifications are possible, for example after step (C), a portion of the Si layer 706 is left and can be used as source and drain regions 706a, 706b, respectively. Metals or silicide layers 713a, 713b may be applied to these regions 706a, 706b. Passivation film 714 is again formed. Another modification is shown in FIG. 7(F) where Si layer 706 is wholly oxidized to form an insulating layer 715, and source, drain electrodes 716a, 716b are applied through windows. Passivation film 717 is again formed in above mentioned figure the lead contact to the gate electrode 704 is not shown. In FIG. 7(E) Si layers 706a and 706b serve as barriers against punchthrough by the Al electrodes.

Obviously, many modifications and variations of this invention are possible in light of the above teachings. It is therefore to be understood that within the scope of the appended claims, this invention may be practiced otherwise than as specifically described.

What is claimed as new and desired to be secured by Letters Patent of the United States is:

1. A method of making a semiconductor device comprising:
   a. preparing a semiconductor substrate;
   b. depositing a non-monocrystalline semiconductor layer doped with predetermined impurity atoms on at least a portion of said semiconductor substrate;
   c. depositing an oxide layer doped with the same type of impurity atoms as said predetermined impurity atoms on said non-monocrystalline semiconductor layer, thus forming a double layer diffusion source; and
   d. heating the semiconductor substrate to diffuse said impurity atoms from said double layer diffusion source into the semiconductor substrate and to form a diffused region in the substrate.

2. The method recited in claim 1 wherein step (a) comprises preparing a Si substrate; and step (b) comprises depositing a non-monocrystalline Si layer doped with predetermined impurity atoms on at least a portion of said Si substrate.

3. The method recited in claim 1 wherein step (b) comprises depositing a non-monocrystalline semiconductor layer doped with over $1 \times 10^{21}/cm^3$ of impurity atoms; and step (c) comprises depositing an oxide layer doped with over $1 \times 10^{21}/cm^3$ of impurity atoms.

4. The method recited in claim 3 wherein step (b) comprises depositing a non-monocrystalline semiconductor layer having a thickness in the range 50 to 500 A; and step (c) comprises depositing an oxide layer having a thickness in the range 500 to 4000 A.

5. The method recited in claim 1 including the step of using the diffused region as the emitter of a bipolar transistor.

6. The method recited in claim 1 wherein step (d) comprises heating the semiconductor substrate in an oxidizing ambient.

7. The method recited in claim 1 wherein step (d) comprises heating the semiconductor substrate at a temperature in the range of 900° C to 1100° C to diffuse said impurity atoms from said double layer diffusion source into the semiconductor substrate and to form a diffused region in the substrate.

8. A method of making a semiconductor device comprising:
   a. preparing a semiconductor substrate;
   b. depositing a non-monocrystalline semiconductor layer doped with predetermined impurity atoms on at least a portion of said semiconductor substrate;
   c. depositing an oxide layer doped with the same type impurity atoms as said predetermined impurity atoms on said non-monocrystalline semiconductor layer, thus forming a double layer diffusion source;
   d. heating the semiconductor substrate to diffuse said impurity atoms from said double layer diffusion source into the semiconductor substrate and to form a diffused region in the substrate;
   e. removing said double layer diffusion source to expose a fresh surface of the semiconductor substrate;

f. forming an epitaxial semiconductor layer on the fresh surface of the semiconductor substrate; and g. forming semiconductor device elements in said epitaxial semiconductor layer.

9. A method as in claim 8, including the steps of forming a bipolar transistor in said epitaxial semiconductor layer and connecting the collector electrode to said diffused region.

10. A method of making a MOS field effect transistor comprising:

a. forming a diffusion mask layer on the surface of a semiconductor substrate;

b. forming windows in said diffusion mask layer through which source and drain diffusion is carried out;

c. depositing a non-monocrystalline semiconductor layer doped with predetermined impurity atoms on the diffusion mask layer and within the windows;

d. depositing an oxide layer doped with the same type impurity atoms as said predetermined impurity atoms on said non-monocrystalline semiconductor layer, thus forming a double layer diffusion source; and e. heating the semiconductor substrate to diffuse said impurity atoms from said double layer diffusion source into the semiconductor substrate and to form source and drain regions in the substrate.

* * * * *